(12) United States Patent
Barlocchi et al.

(10) Patent No.: US 6,506,663 B1
(45) Date of Patent: Jan. 14, 2003

(54) METHOD FOR PRODUCING AN SOI WAFER

(75) Inventors: Gabriele Barlocchi, Cornaredo (IT); Flavio Villa, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/457,623

(22) Filed: Dec. 8, 1999

(30) Foreign Application Priority Data

Dec. 10, 1998 (EP) .............................. 98830743

(51) Int. Cl.⁷ .............................. H01L 21/76
(52) U.S. Cl. ........................ 438/424; 438/435
(58) Field of Search ................. 438/421, 424, 438/430, 432, 435

(56) References Cited

U.S. PATENT DOCUMENTS

| | | | |
|---|---|---|---|
| 5,236,803 A | * 8/1993 | Iranmanesh | 438/424 |
| 5,719,085 A | * 2/1998 | Moon et al. | 438/424 |
| 5,763,315 A | * 6/1998 | Benedict et al. | 438/424 |
| 5,877,007 A | * 3/1999 | Kimura et al. | 438/425 |
| 5,888,881 A | * 3/1999 | Jeng et al. | 438/425 |
| 6,103,635 A | * 4/2000 | Chau et al. | 438/424 |
| 6,093,611 A | * 7/2000 | Gardner et al. | 438/424 |
| 6,100,163 A | * 8/2000 | Jang et al. | 438/425 |
| 6,180,491 B1 | * 1/2001 | Joyner | 438/424 |

FOREIGN PATENT DOCUMENTS

| | | |
|---|---|---|
| GB | 2156 149 A | 10/1985 |
| JP | 05 343320 A | 12/1993 |

\* cited by examiner

Primary Examiner—Savitri Mulpuri
(74) Attorney, Agent, or Firm—Lisa K. Jorgenson; E. Russell Tarleton; Seed IP Law Group PLLC

(57) ABSTRACT

A method for providing an SOI wafer that includes, on a wafer of monocrystalline semiconductor material, forming a hard mask of an oxidation-resistant material, defining first protective regions covering first portions of the wafer; excavating the second portions of the wafer, forming initial trenches extending between the first portions of the wafer; thermally oxidating the wafer, forming a sacrificial oxide layer extending at the lateral and base walls of the initial trenches, below the first protective regions; and wet etching the wafer, to completely remove the sacrificial oxide layer. Thereby, intermediate trenches are formed, the lateral walls of which are recessed with respect to the first protective regions. Subsequently, a second oxide layer is formed inside the intermediate trenches; a second silicon nitride layer is deposited; final trenches are produced; a buried oxide region is formed, and finally an epitaxial layer is grown.

6 Claims, 5 Drawing Sheets

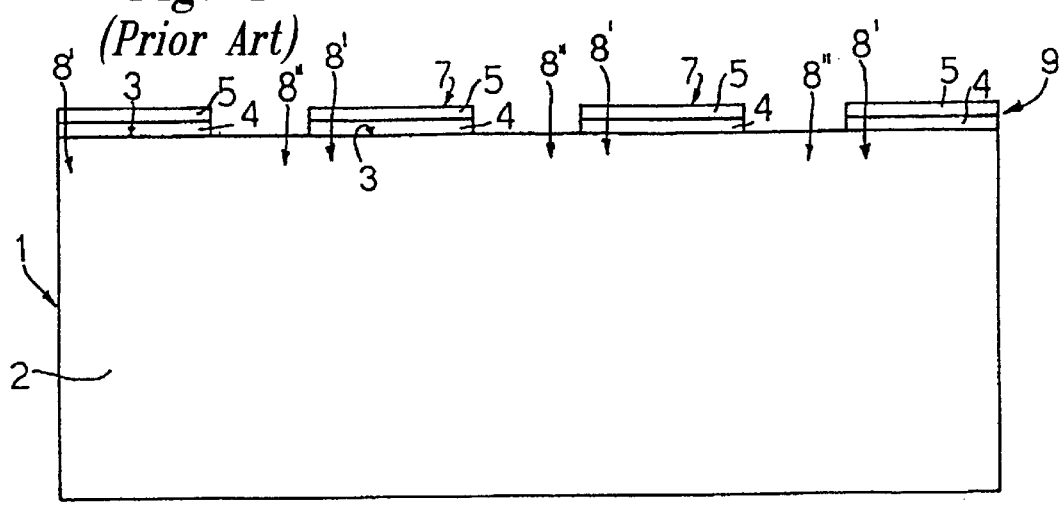
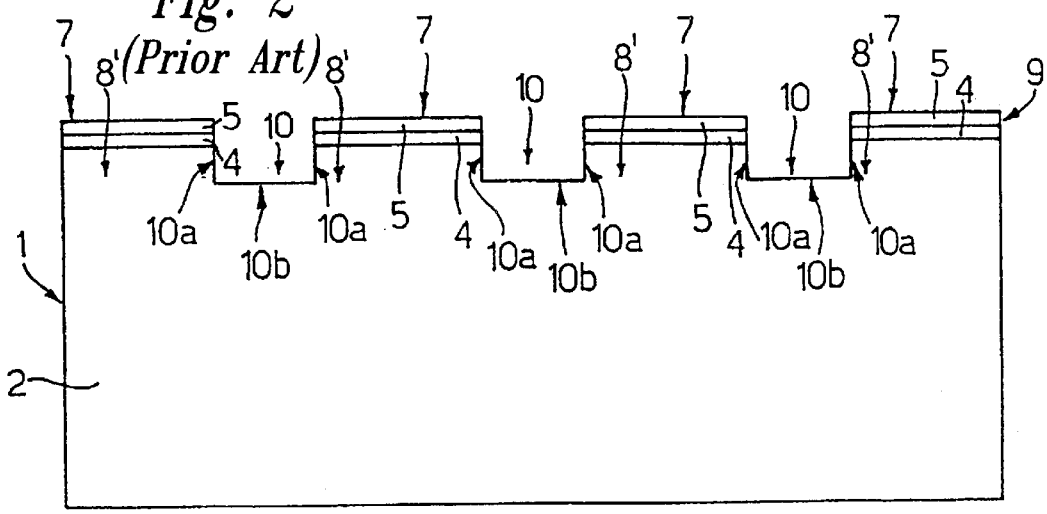
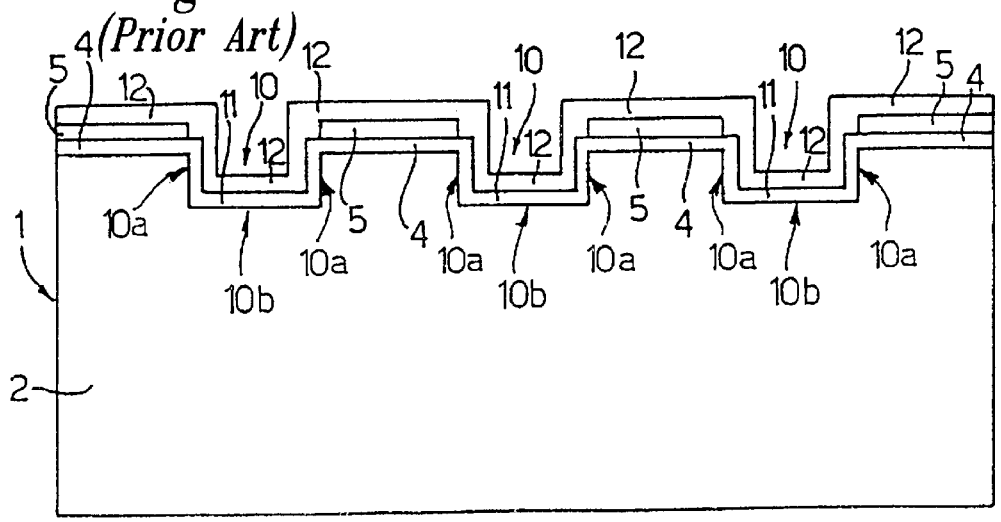

METHOD FOR PRODUCING AN SOI WAFER

TECHNICAL FIELD

The present invention relates to an improved method for producing a silicon-on-insulator (SOI) wafer.

BACKGROUND OF THE INVENTION

As known, according to widespread practice in the microelectronics industry, the substrate of integrated devices is obtained from wafers of monocrystalline silicon. In the last few years, as an alternative to wafers consisting of silicon alone, composite wafers, so-called "SOI" (Silicon-on-Insulator) wafers have been proposed, comprising two silicon layers, one of which is thinner than the other, separated by a silicon oxide layer.

A method for producing SOI wafers is the subject of European patent application no. 98830007.5 filed on Jan. 13, 1998 for the same applicant, and is described hereinafter with reference to FIGS. 1–9.

According to this method, and referring to the figures, on a surface 3 of a monocrystalline silicon region 2, initially a first silicon oxide layer is grown, having a thickness for example comprised between 200 and 600 Å; a first silicon nitride layer having a thickness comprised between 900 and 1500 Å is then deposited. Using a resist mask, dry etching is carried out of the uncovered portions of the first oxide layer and the first nitride layer, and the resist mask is then removed, providing the intermediate structure of FIG. 1, wherein the wafer thus obtained is shown at 1, and the portions of the first oxide layer and the first nitride layer remained after dry etching, are indicated at 4 and 5 and define respective first protective regions 7, covering first portions 8' of monocrystalline silicon region 2.

The first protective regions 7 form a hard mask, indicated at 9 and are used to etch the monocrystalline silicon region 2 at the second portions 8" left uncovered by the mask 9, such as to form initial trenches 10 (FIG. 2), having a depth comprised between 0.5 and 5 µm, depending on the desired characteristics of the buried oxide layer to be produced.

Subsequently, as shown in FIG. 3, the wafer 1 is subjected to oxidation, to form a second oxide layer 11, having a thickness, e.g. comprised between 200 and 600 Å, and covering the lateral and base walls 10a, 10b of the initial trenches 10, and a second silicon nitride layer 12 having a thickness comprised between 900 and 1500 Å is then deposited.

Subsequently, layers 12 and 11 are anisotropically etched without a mask. Owing to the etching anisotropy, the horizontal portions of the second silicon nitride layer 12 and the oxide layer 11, on the base walls 10b of the initial trenches 10 and on the portions 4 and 5, are removed, thus providing the intermediate structure of FIG. 4. The regions 8' are still covered on top by the mask 9, and laterally (on the vertical walls 10a) by oxide and nitride portions 11' and 12'; on the other hand, the monocrystalline silicon region 2 is bare on the base wall I0b of the initial trenches 10.

The uncovered silicon, at the base wall 10b of the initial trenches 10 is etched, to deepen the initial trenches 10, obtaining final trenches 16 having a required depth. In particular, the depth of the final trenches 16 (like that of the initial trenches 10) determines the dimensions of the desired covered oxide layer, and thus the electrical characteristics of the SOI wafer, as explained hereinafter, and is thus selected according to the specifications provided for the final SOI wafer.

The monocrystalline silicon region now comprises a base portion shown at 2', and a plurality of "columns" 18, extending vertically from the base portion 2'. Thus the intermediate structure of FIG. 5 is obtained, wherein the nitride portions 5 and 12' are no longer separate from each other, and are indicated at 19, and the oxide portions 4 and 11' are also no longer separate from each other, and are indicated at 20 and, with the portions 19, form second protective regions 30.

A thermal oxidation step is then carried out, thereby the exposed silicon regions of the "columns" 18 are transformed into silicon oxide. In practice, the oxide regions gradually grow from the silicon regions, from the lateral walls of the final trenches 16 towards the interior of the columns, and partially also towards and inside the base portion 2'. Since during the oxidation the volume increases, the oxide regions that are being formed gradually, occupy the space of the final trenches 16, until they close the latter completely, and are joined to one another. The oxidation step ends automatically once the columns 18 have been completely oxidized (apart from the upper area or tip, indicated at 21, which is protected by the second protective regions 30), thus forming a continuous buried oxide region 22, shown in FIG. 6, wherein continuous vertical lines show meeting surfaces of the oxide regions being formed from walls of two final adjacent trenches 16, showing the oxide expansion.

Subsequently, by selective etching, the second protective regions 30 are removed and uncover the "tips" 21, which are designed to form the nuclei for a subsequent epitaxial growth.

The structure of FIG. 7 is obtained, showing the three-dimensional structure of the wafer I in this step. Subsequently, epitaxial growth is carried out, the parameters whereof being selected to avoid silicon nucleation in the areas above the buried oxide region 22, and to have a high ratio of lateral to vertical growth, to obtain first horizontal growth of silicon around the tips 21 (thus covering the upper surface of the buried oxide region 22), and then vertical growth of an epitaxial layer 23. After an optional step of chemical/mechanical polishing to level the upper surface of the wafer 1, the final structure of the wafer 1, shown in FIG. 8, is then obtained.

Thereby it is possible to produce an SOI wafer using only process steps common in microelectronics, with far lower costs than those of the processes used now for production of SOI substrates.

However, the above-described production method has the disadvantage that during the step of non-masked anisotropic etching, there are uncovered oxide portions, which, during the subsequent epitaxial step, produce extensive areas rich in crystallographic defects.

In particular, as illustrated in greater detail in FIG. 9, relative to a single initial trench, the second oxide layer grows, inter alia, towards the interior of the initial trench 10, forming steps 39. Consequently, when subsequently depositing the second silicon nitride layer 12, the latter follows the inner profile of the lateral walls of the initial trenches 10, and thus in turn forms a pair of steps 40 in each initial trench 10.

The presence of these steps 39, 40 means that in the subsequent step of non-masked anisotropic etching of the layers 12 and 11, not only the horizontal portions of the second silicon nitride 12 and oxide 11 layers are removed on the base of the initial trenches 10, and above the portions 4 and 5, but also the portions of the second silicon nitride layer 12 which form the steps 40, thus leaving uncovered the portions of the second oxide layer 11' defining the steps 39, as illustrated in FIG. 10.

Consequently, in the subsequent oxidation step for growing the buried oxide region 22, silicon oxide is grown at the steps 39, forming oxide areas 41 (FIG. 11). These oxide areas 41 cause the formation, in the subsequent epitaxial growth, of extensive areas rich in crystallographic defects in the epitaxial layer 23, which areas are delimited by broken lines in FIG. 12.

SUMMARY OF THE INVENTION

The present invention improves the above-described method so as to eliminate the crystallographic defects present in the epitaxial layer and to obtain improvement of the electrical characteristics of the SOI wafer.

According to the disclosed embodiments, a process for producing a wafer includes forming a protective layer over selected portions of a substrate, the protective layer comprising a non-insulating layer and an insulating layer formed between the noninsulating layer and the substrate; forming a first trench in non-selected portions of the substrate, the first trench having lateral walls and a base wall; and removing surface area from the lateral walls of the first trench and from end portions of the insulating layer to form a second trench from the first trench.

BRIEF DESCRIPTION OF THE DRAWINGS

To aid in understanding of the invention, a preferred embodiment is now described, purely by way of non-limiting example with reference to the attached drawings, wherein:

FIGS. 1–6 show cross-sections through an SOI wafer in successive production steps according to a known method;

DETAILED DESCRIPTION OF THE DRAWINGS

Figure 4:
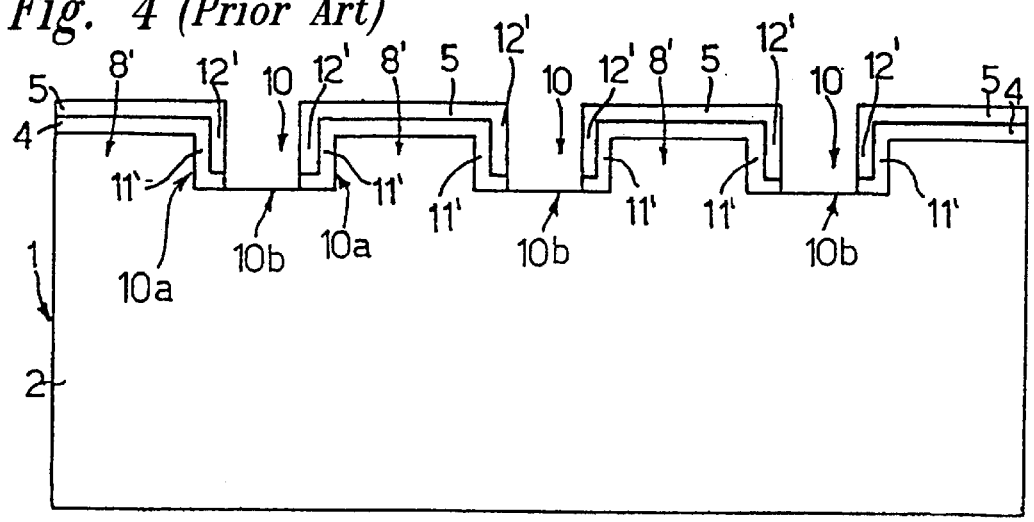
Figure 5:
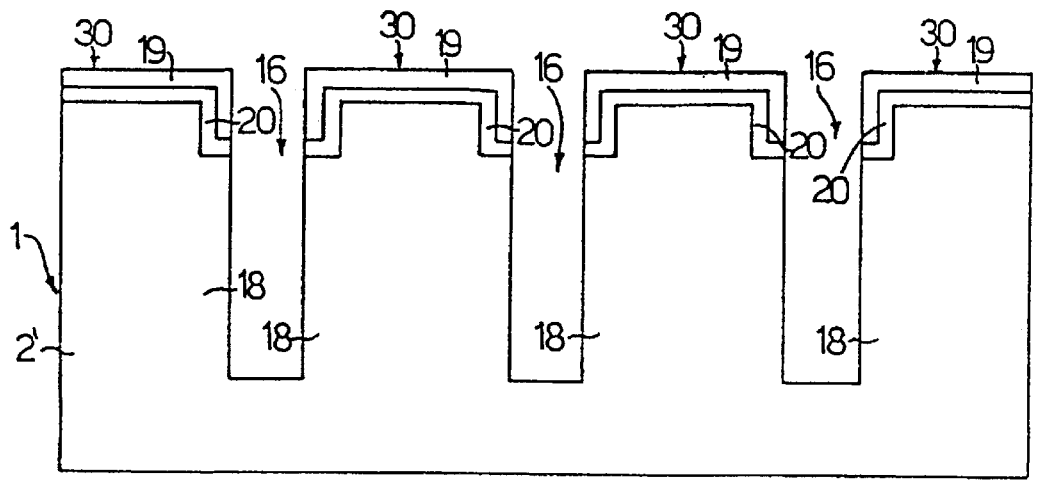
Figure 6:
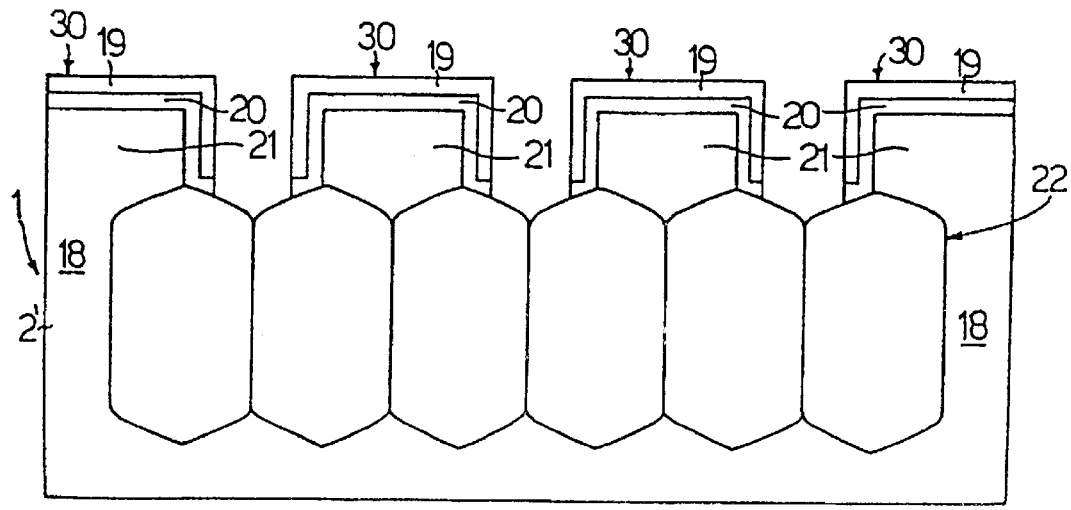
Figure 7:
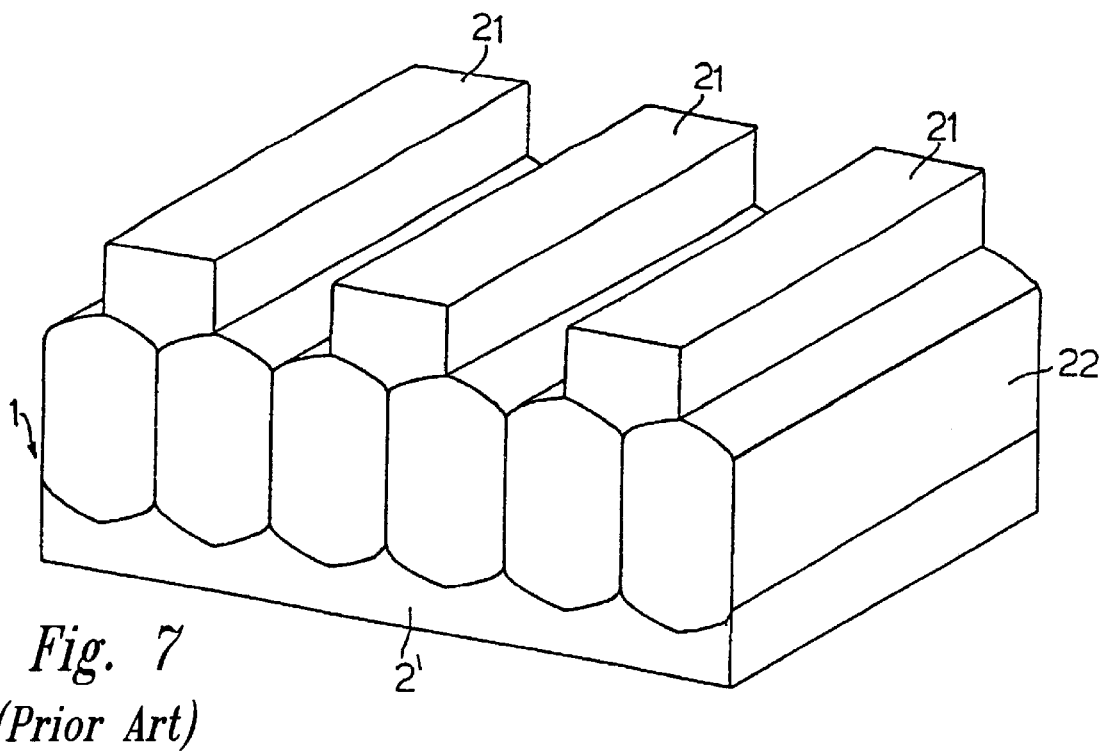
FIGS. 7 and 8 show perspective cross-sections in two successive steps of the known production method.
Figure 8:
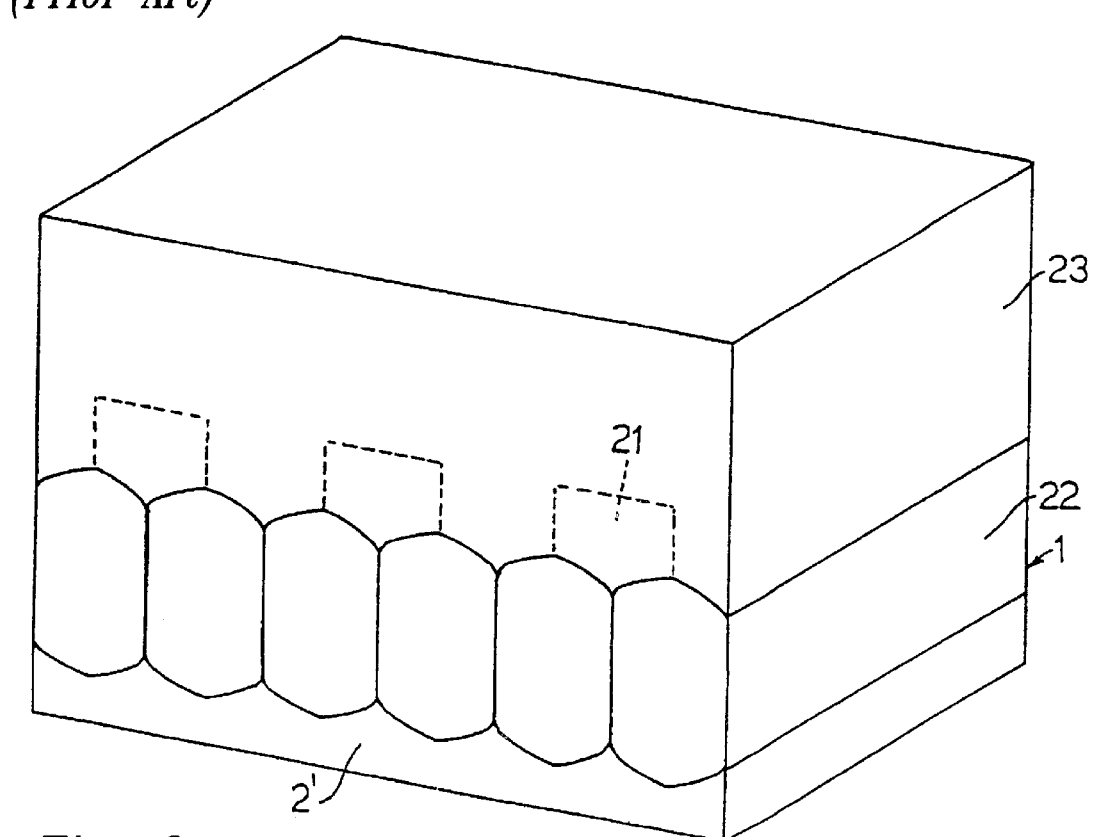
Figure 9:
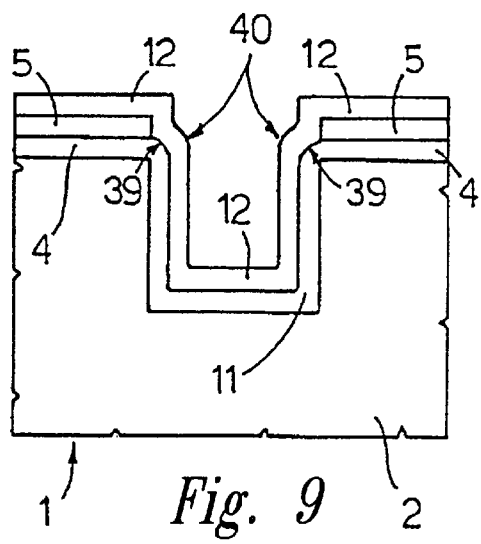
FIGS. 9–12 show cross-sections through an SOI wafer, relative to the known production method.
Figure 10:
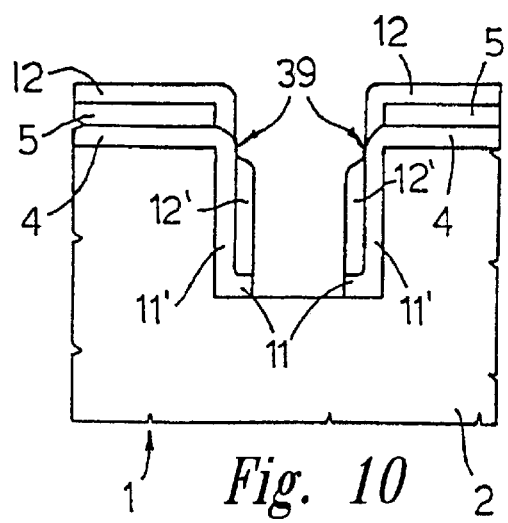

The disclosed embodiment is based on the principle of having the oxidation step, leading to the formation of the second oxide layer 11, preceded by a step of removal of surface regions of the lateral walls 10a of the initial trenches 10, so that the trenches thus widened extend partially below the protective regions 7, and thus prevent the formation of the steps 39.

In particular, the surface regions of the lateral walls 10a are removed through a thermal oxidation step for forming a sacrificial oxide layer, covering the lateral walls 10a and the base wall 10b of the initial trenches 10; then the sacrificial oxide layer is wet etched, preferably using hydrofluoric acid, to completely remove the sacrificial oxide layer.

The oxidation for forming the sacrificial oxide layer is preferably prolonged so that the sacrificial oxide layer is much thicker than the oxide layer 11, and in particular has a thickness comprised between 2000 and 4000 Å.

Figure 13:
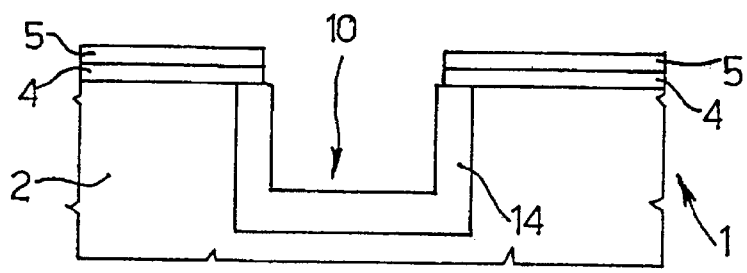
FIGS. 13–17 show cross-sections through an SOI wafer during production steps according to the present method.

Since during the thermal oxidation step, the oxide is grown both towards the interior of the initial trenches 10, and towards the interior of the first portions 8' of the monocrystalline silicon regions 2 (which are partially "consumed" by the oxide formed), the sacrificial oxide layer penetrates the first portions 8', below the first protective regions 7, in a far more accentuated manner than for the oxide layer 11, thus forming the intermediate structure of FIG. 13, wherein the sacrificial oxide layer is indicated at 14.

Figure 14:
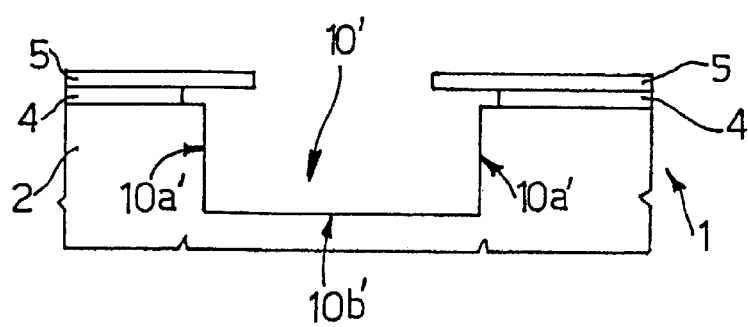

During the subsequent wet etching, the sacrificial oxide layer 14 is then completely removed, and the ends of the oxide portions 4 are also removed, thus providing the intermediate structure illustrated in FIG. 14.

In particular, removal of the portions of the sacrificial oxide layer 14 arranged below the first protective regions 7, and covering the lateral walls 10a of the initial trenches 10, widens the initial trenches 10, thus forming intermediate trenches 10' extending partially also below the first protective regions 7; consequently, the nitride portions 5 now project slightly with respect to the lateral walls, indicated at 10a', of the intermediate trenches 10'.

Figure 15:
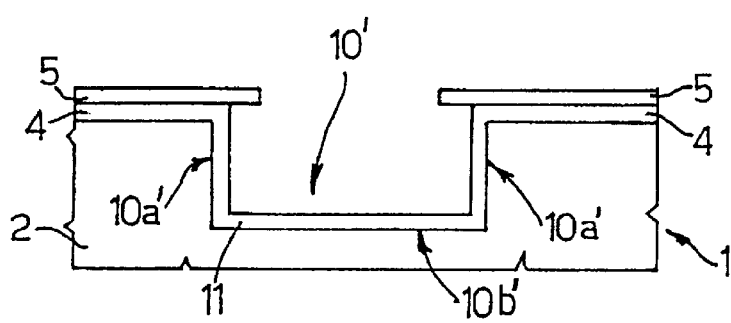
Figure 16:
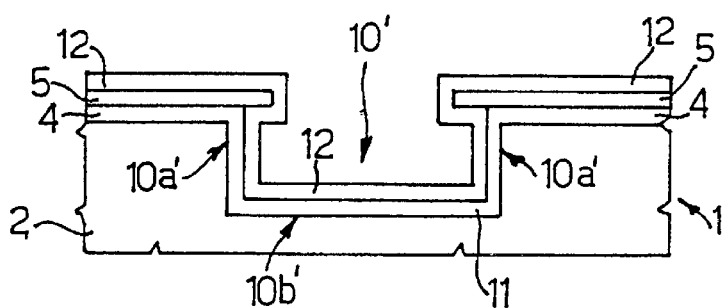

Subsequently, similarly to the above description with reference to FIG. 3, the wafer 1 is oxidized, for forming the second oxide layer 11 covering the lateral walls 10a' and the base wall 10b' of the intermediate trenches 10' (FIG. 15), and the second silicon nitride layer 12 is then deposited; thereby, the intermediate structure shown in FIG. 16 is obtained.

The steps previously described with reference to FIGS. 4–8 are then carried out, for forming the final trenches 16 (which are 1–4 μm deeper than the intermediate trenches 10'), forming the buried oxide region 22, removing the protective oxide and nitride portions 30, and growing the epitaxial layer 23.

Figure 11:
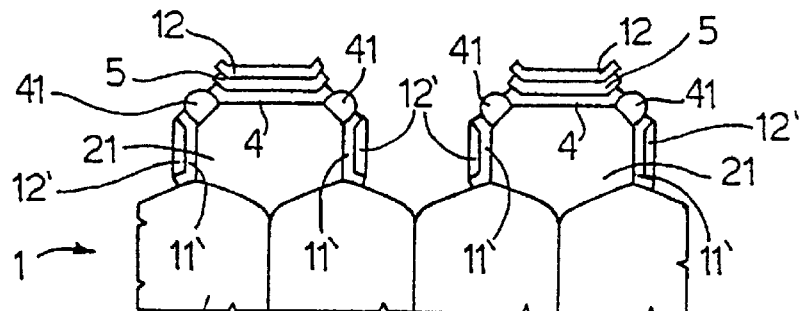
Figure 12:
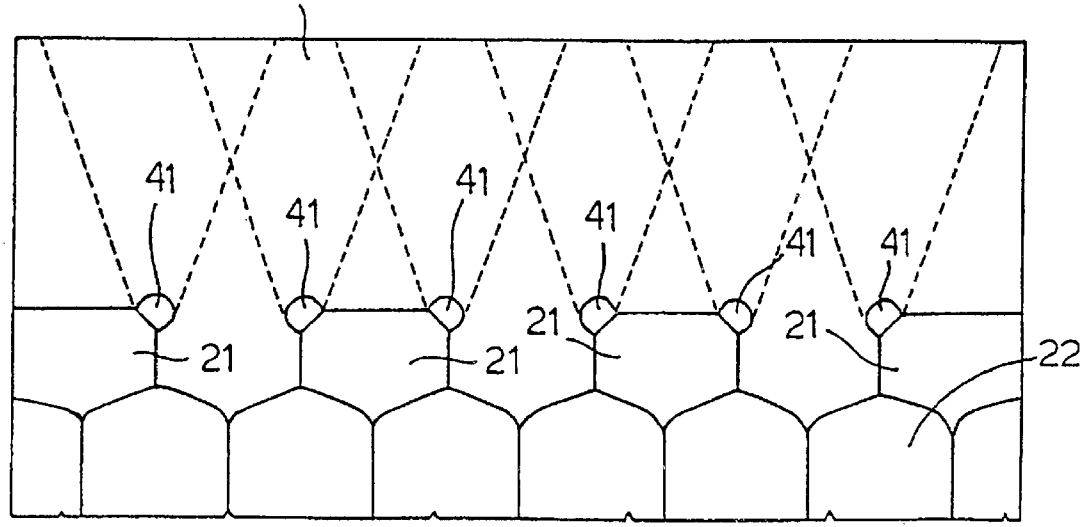
Figure 17:
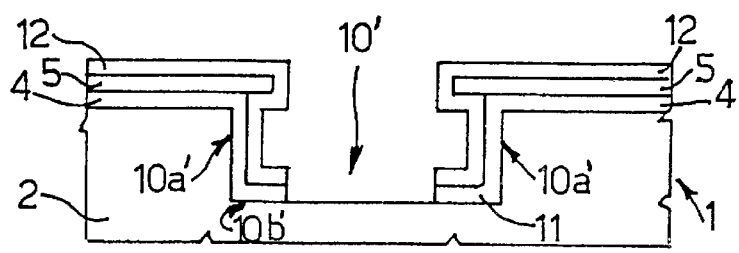

In particular, during non-masked anisotropic etching of layers 11, 12, uncovered oxide steps are not formed, as shown in FIG. 17, corresponding to FIG. 4 of the known method, thus preventing the problem above-described with reference to FIG. 11.

Consequently, the described method produces an epitaxial layer 23 without crystallographic defects, and thus SOI wafers having far better electrical characteristics than the SOI substrate described in the above-described patent application, with far lower costs than with the currently used methods for producing such substrates.

In addition, the improvement in the final electrical characteristics is obtained without using additional masks, and through simple oxidation and wet etching steps, and thus with low costs and in a well-controllable way, since the used steps are individually used in the production of integrated circuits.

Finally, it is apparent that many modifications and variants can be made to the method described and illustrated here without departing from the scope of the invention as defined in the attached claims. For example, the initial trenches 10 can also be widened using a different technique from that described.

As another example, above the first nitride layer 5, there could be deposited a TEOS (tetraethylorthosilicate) oxide layer, having a thickness comprised, e.g., between 5000 and 7000 Å, and preferably 6000 Å, subsequently defined with the first nitride layer 5, and with the first oxide layer 4, to form the hard mask 9, for better protecting the first portions 8' of the monocrystalline silicon region 2 during the various processing steps of the wafer 1.

What is claimed is:

1. A method for producing a silicon-on-insulator (SOI) wafer, comprising:

forming a first silicon oxide layer on a monocrystalline silicon region;

forming a first silicon nitride layer on the first silicon oxide layer;

etching selected portions of the first silicon oxide layer and first silicon nitride layer to form protective regions covering first portions of the monocrystalline silicon region and leaving uncovered second regions thereon;

etching the uncovered second regions to form trenches, each trench having parallel lateral walls and a base wall;

forming a sacrificial oxide layer on the lateral walls and the base wall of the trenches that partially consumes portions of the lateral walls and the base shall of the trenches; and removing the sacrificial oxide layer and the consumed portions of the lateral walls, including end portions of the first silicon oxide layer below the first silicon nitride layer to form second trenches having dimensions larger than the first trenches and to form a projection of the first silicon nitride layer that projects over the lateral walls of the second trenches and over a subsequent layer of silicone oxide and a subsequent layer of silicone nitride on the lateral walls of the second trenches.

2. The method of claim 1 wherein forming a sacrificial oxide layer comprises thermally oxidating the wafer to form the sacrificial oxide layer.

3. The method of claim 2 wherein the sacrificial oxide layer extends partially below the first silicon nitride layer.

4. The method of claim 1 wherein the sacrificial oxide layer has a thickness of between 2000 and 4000 Å.

5. The method of claim 1 wherein etching the second portions comprises wet etching the second portions.

6. A manufacturing process for producing a silicon-on-insulator (SOI) wafer, comprising:

forming a first silicon oxide layer on a monocrystalline silicone region;

forming a first silicon nitride layer on the first silicon oxide layer;

etching selected portions of the first silicon oxide layer and the first silicon nitride layer to form protective regions covering first portions of the monocrystalline silicone region and leaving uncovered second regions thereon;

etching the uncovered second regions of the monocrystalline silicone to form first trenches, each first trench having parallel lateral walls and a base wall;

forming a sacrificial oxide layer on the parallel lateral walls and the base wall of the first trenches, the sacrificial oxide layer configured to consume portions of the lateral walls and the base wall of the first trenches;

removing the sacrificial oxide layer and the consumed portions of the lateral walls and the base wall, including end portions of the first silicon oxide layer below the first silicon nitride layer to form second trenches having dimensions larger than the first trenches and to form a projection of the first silicon nitride layer that projects over the lateral walls of the second trenches;

forming a second silicone oxide layer and a second silicone nitride layer on the second silicon oxide layer on the lateral walls and base wall of the second trenches so that the projection extends over the second silicone oxide layer and second silicone nitride layer on the lateral walls of the trenches;

etching a portion of the second silicone oxide layer and the second silicone nitride layer that are formed over the base wall of the second trenches to expose a portion of the monocrystalline silicone therebelow; and anisotropically etching the exposed monocrystalline silicone to form a third trench structure that is deeper than the second trench and has a stepped configuration.

* * * * *

UNITED STATES PATENT AND TRADEMARK OFFICE
CERTIFICATE OF CORRECTION

PATENT NO. : 6,506,663 B1
DATED : January 14, 2003
INVENTOR(S) : Gabriele Barlocchi et al.

It is certified that error appears in the above-identified patent and that said Letters Patent is hereby corrected as shown below:

<u>Column 5,</u>
Line 6, "the base shall" should read as -- the base wall --.

Signed and Sealed this

Twenty-fifth Day of March, 2003

JAMES E. ROGAN
*Director of the United States Patent and Trademark Office*